United States Patent [19]

Stevenson et al.

[11] Patent Number: 5,200,049

[45] Date of Patent: Apr. 6, 1993

[54] CANTILEVER MOUNT FOR ROTATING CYLINDRICAL MAGNETRONS

[75] Inventors: David E. Stevenson; Erik J. Bjornard, both of Northfield, Minn.; Geoffrey H. Humberstone, Holland, Mich.

[73] Assignee: Viratec Thin Films, Inc., Faribault, Minn.

[21] Appl. No.: 737,372

[22] Filed: Jul. 29, 1991

Related U.S. Application Data

[63] Continuation-in-part of Ser. No. 566,214, Aug. 10, 1990, abandoned.

[51] Int. Cl.[5] ............................................. C23C 14/35
[52] U.S. Cl. ............................ 204/298.22; 204/298.09
[58] Field of Search ................... 204/298.09, 298.22, 204/298.23

[56] References Cited

U.S. PATENT DOCUMENTS

| | | | |
|---|---|---|---|
| 4,166,018 | 8/1979 | Chapin | 204/192.12 |
| 4,356,073 | 10/1982 | McKelvey | 204/192.12 |
| 4,417,968 | 11/1983 | McKelvey | 204/192.12 |
| 4,422,916 | 12/1983 | McKelvey | 204/192.12 |
| 4,443,318 | 4/1984 | McKelvey | 204/298.23 |
| 4,445,997 | 5/1984 | McKelvey | 204/298.23 |
| 4,466,877 | 8/1984 | McKelvey | 204/298.23 |
| 4,519,885 | 5/1985 | Innis | 204/192.12 |
| 4,904,362 | 2/1990 | Gaertner et al. | 204/192.12 |
| 5,100,527 | 3/1992 | Stevenson et al. | 204/298.22 |

OTHER PUBLICATIONS

"Design Advances and Applications of the Rotatable Magnetron," Proceedings of the 32nd National Symposium of the American Vacuum Society, vol. 4, No. 3, Part 1, pp. 388-392 (1986).

"Recent Advances in the Design and Application of the Rotatable Cylindrical Magnetron," Wright, M., et al., Annual Technical Conference, Society of Vacuum Coaters (1986).

*Primary Examiner*—Aaron Weisstuch
*Attorney, Agent, or Firm*—Heller, Ehrman, White & McAuliffe

[57] ABSTRACT

An apparatus for rotatably mounting a cylindrical magnetron in a vacuum chamber. The apparatus includes a bearing housing having one end extending into the vacuum chamber with the other end located outside the chamber. A drive shaft is rotatably mounted in the bearing housing. Each end of the drive shaft extends beyond the housing. The cylindrical magnetron is attached to the end of the drive shaft inside the chamber. A vacuum seal is located in the bearing housing for sealing the drive shaft to the housing. The drive shaft is mounted in the housing such that the load of the magnetron is not transferred to the vacuum seal.

24 Claims, 3 Drawing Sheets

CANTILEVER MOUNT FOR ROTATING CYLINDRICAL MAGNETRONS

This application is a continuation-in-part of application Ser. No. 07/566,214, filed Aug. 10, 1990, now abandoned.

BACKGROUND OF THE INVENTION

The present invention relates generally to sputter deposition of thin films using rotating cylindrical magnetrons, and more particularly to mounting arrangements for such magnetrons.

DC reactive sputtering is the process most often used for large area commercial coating applications, such as the application of thermal control coatings to architectural and automobile glazings. In this process, the articles to be coated are passed through a series of in-line vacuum chambers isolated from one another by vacuum locks. Such a system may be referred to as a continuous in-line system or simply a glass coater.

Inside the chambers, a sputtering gas discharge is maintained at a partial vacuum at a pressure of about three millitorr. The sputtering gas comprises a mixture of an inert gas, such as argon, with a small proportion of a reactive gas, such as oxygen, for the formation of oxides.

Each chamber contains one or more cathodes held at a negative potential of about $-200$ to $-1000$ volts. The cathodes may be in the form of elongated rectangles, the length of which spans the width of the line of chambers. The cathodes are typically 0.10 to 0.30 meters wide and a meter or greater in length. A layer of material to be sputtered is applied to the cathode surface. This surface layer or material is known as the target or the target material. The reactive gas forms the appropriate compound with this material.

Ions from the sputtering gas discharge are accelerated into the target and dislodge, or sputter off, atoms of the target material. These atoms, in turn, are deposited on a substrate, such as a glass sheet, passing beneath the target. The atoms react on the substrate with the reactive gas in the sputtering gas discharge to form a thin film.

The architectural glass coating process was made commercially feasible by the development of the magnetically-enhanced planar magnetron. This magnetron has an array of magnets arranged in the form of a closed loop and mounted in a fixed position behind the target. A magnetic field in the form of a closed loop is thus formed in front of the target plate. The field causes electrons from the discharge to be trapped in the field and travel in a spiral pattern, which creates a more intense ionization and higher sputtering rates. Appropriate water cooling is provided to prevent overheating of the target. The planar magnetron is further described in U.S. Pat. No. 4,166,018.

A disadvantage of the planar magnetron is that the target material is only sputtered in the narrow zone defined by the magnetic field. This creates a "racetrack"-shaped sputtering zone on the target. Thus, a "racetrack"-shaped erosion zone is produced as sputtering occurs. This causes a number of problems. For example, (1) localized high temperature build-up eventually limits the power at which the cathodes can operate, and (2) only about 25 percent of the target material is actually used before the target must be replaced.

The rotary or rotating cylindrical magnetron was developed to overcome some of the problems inherent in the planar magnetron. The rotating magnetron uses a cylindrical cathode and target. The cathode and target are rotated continually over a magnetic array which defines the sputtering zone. As such, a new portion of the target is continually presented to the sputtering zone which eases the cooling problem, allowing higher operating powers. The rotation of the cathode also ensures that the erosion zone comprises the entire circumference of the cathode covered by the sputtering zone. This increases target utilization. The rotating magnetron is described further in U.S. Pat. Nos. 4,356,073 and 4,422,916, the entire disclosures of which are hereby incorporated by reference.

The rotating magnetrons, while solving some problems, presented others. Particularly troublesome has been the development of suitable apparatus for driving and supporting the magnetron in the coating chamber. Vacuum and rotary water seals have been used to seal around the drive shaft and cooling conduits which extend between the coating chamber and the ambient environment. However, such seals have a tendency to develop leaks under conditions of high temperature and high mechanical loading.

Various mounting, sealing, and driving arrangements for cylindrical magnetrons are described in U.S. Pat. Nos. 4,443,318; 4,445,997; and 4,466,877, the entire disclosures of which are also hereby incorporated by reference. These patents describe rotating magnetrons mounted horizontally in a coating chamber and supported at both ends. It is often preferable, however, to support the magnetron at only one end by a cantilever mount. However, the cantilever mounting arrangement produces the highest bearing loads. Several examples of cantilever mounted rotary magnetrons are given in *Design Advances and Applications of the Rotatable Magnetron*. Proceedings of the 2nd National Symposium of the American Vacuum Society, Vol. 4, No. 3, Part 1, pages 388–392 (1986), the entire text of which is hereby incorporated by reference.

Conventional bearings alone are not particularly suitable for mounting a rotary magnetron. Such bearings do not operate well in a vacuum environment, as their lubricants have too high a vapor pressure. Additionally, some sort of vacuum seal has to be provided.

Rotary vacuum seals have been used to seal around the drive shafts and the cooling conduits extending into the coating chamber. These seals must make contact with the drive shaft or conduits, and the aperture in the vacuum chamber through which the shaft and conduits pass. A rotary vacuum seal also may function as a bearing. High operating temperatures and bearing loads, however, can accelerate wear on the seals, causing vacuum leaks.

Rotary water seals have also been used on rotary magnetrons. However, they are very unreliable when operated in a vacuum. Specifically, these seals tend to break down after a relatively short period of operation.

Such factors have all contributed to the unreliability and leakage problems associated with the use of rotating magnetrons.

In view of the foregoing, an object of the present invention is to provide an improved mount for a rotating cylindrical magnetron.

A more specific object of the present invention is to provide a cantilever mount for a rotating cylindrical magnetron which will operate for extended periods without failure due to leaks in its vacuum seals and bearings.

Additional objects and advantages of the invention will be set forth in the description which follows or may be learned by practice of the invention. Other objects and advantages of the invention may be realized and obtained by means of the instrumentalities and combinations particularly pointed out in the claims.

SUMMARY OF THE INVENTION

The present invention comprises an apparatus for rotatably mounting a cylindrical magnetron in a vacuum chamber. The apparatus includes a bearing housing having one end thereof extending into the chamber with the other end located outside the chamber. A drive shaft is rotatably mounted in the bearing housing. Each end of the drive shaft extends beyond the housing, and the cylindrical magnetron is attached to the end of the drive shaft inside the chamber. A vacuum seal is located in the bearing housing for sealing the drive shaft to the housing. The drive shaft is mounted in the housing so that the load of the cylindrical magnetron is not transferred to the vacuum seal.

The vacuum seal is located at the end of the bearing housing inside the coating chamber. The seal ensures that the interior of the bearing housing is isolated from the vacuum chamber, which permits conventional bearings to be used for supporting the drive shaft and thus the magnetron.

The bearings are spaced along the drive shaft to provide the cantilever support. The bearings are arranged such that the entire load of the magnetron is supported by the bearings and no load is transferred to the vacuum seal. Since the vacuum seal does not function as a bearing, its effective life is extended significantly. A preferred vacuum seal is a ferrofluidic seal.

The life of the vacuum seal and bearings may be extended by incorporating cooling channels in a dark space shield enclosing the bearing housing.

DESCRIPTION OF THE DRAWINGS

The accompanying drawings which are incorporated in and constitute a part of the specification, schematically illustrate a preferred embodiment of the present invention and together with the general description given above and the detailed description of the preferred embodiment given below serve to explain the principles of the invention.

DETAILED DESCRIPTION OF THE PREFERRED EMBODIMENTS

Figure 1:
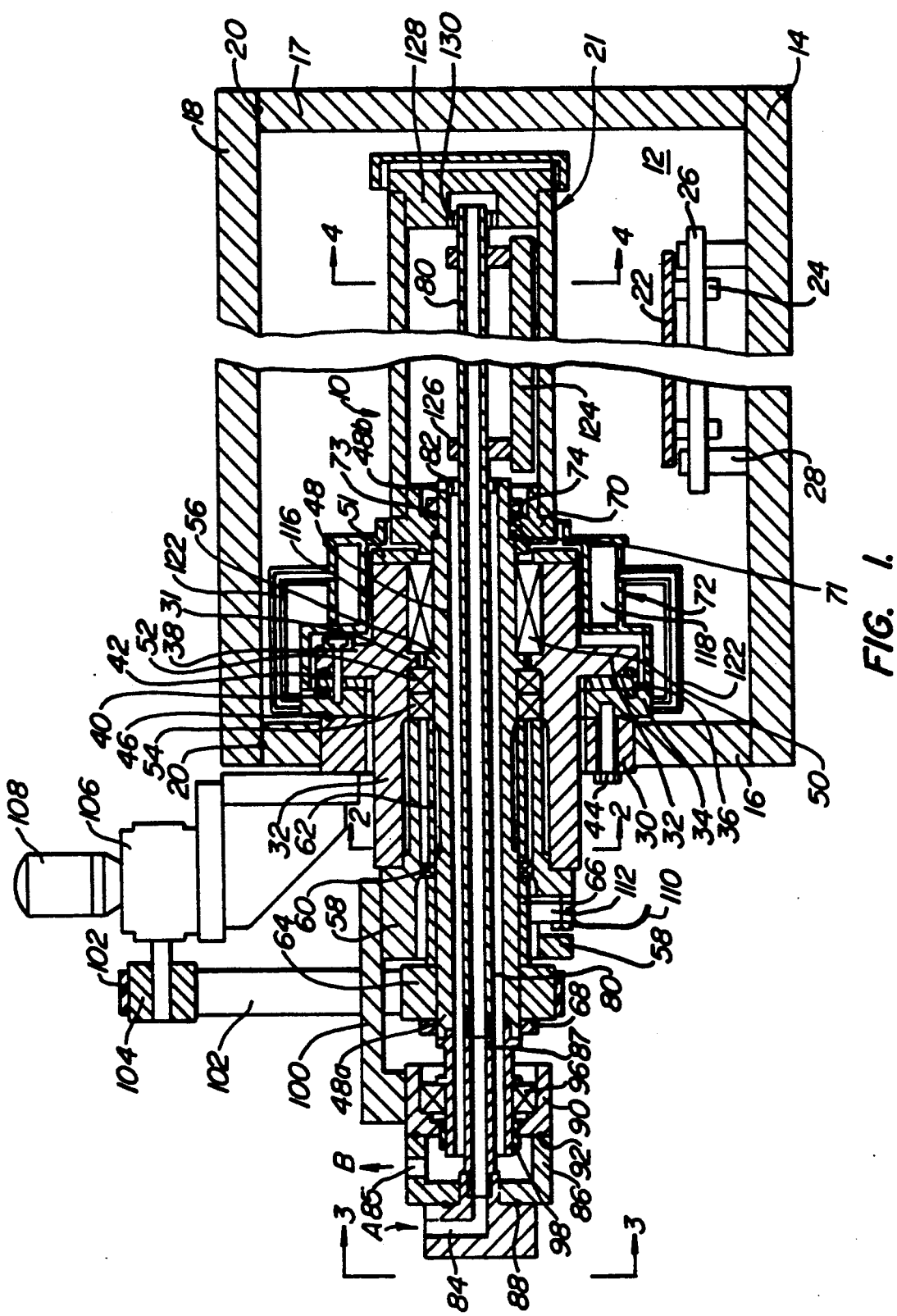
FIG. 1 is a schematic cross-section through a rotating cylindrical magnetron and coating chamber perpendicular to the direction of substrate travel.

The present invention will be described in terms of a preferred embodiment. As shown in FIG. 1, the preferred embodiment is a cantilever mounting arrangement for a rotating cylindrical magnetron 10 disposed in an evacuable coating or vacuum chamber 12. The coating chamber 12 includes a base or floor 14, side walls 16 and 17, and a removable top cover 18. As is known in the art, top cover 18 is sealed to the chamber by a suitable vacuum seal 20. A substrate 22 is transported past a cathode body 21 of magnetron 10. The substrate is supported on rollers 24 which are mounted on a shaft 26 running in bearings 28. The bearings are attached to base 14.

A mounting flange 30 for magnetron 10 (see also FIG. 2) is located in side wall 16. More specifically, bearing housing 32 is mounted to a bearing housing flange 34 by cap screws 38. Bearing housing 32 is electrically-isolated from flange 34 by an insulating disc 36. Vacuum seals 40 and 42, such as O-ring seals, are provided to form a vacuum seal between housing 32 and flange 34. The bearing flange 34 is in turn secured to flange 30 by bolts 44. Vacuum integrity between flanges 30 and 32 is maintained by vacuum seal 46 such as an O-ring seal.

A drive shaft 48 extends through bearing housing 32. The respective ends 48a and 48b of the drive shaft extend outside of the bearing housing. The drive shaft is sealed to housing 32 by a rotary vacuum seal 50. The rotary seal is located between an end stop 51 of bearing housing 32 and a raised shoulder portion 56 formed on drive shaft 48. Seal 50 ensures that the interior of bearing housing 32 is isolated from vacuum chamber 12. Preferably, rotary seal 50 is a ferrofluidic seal. As is known, a ferrofluidic seal incorporates a colloidal suspension of ultramicroscopic magnetic particles in a carrier liquid. Preferably, the ferrofluidic seal are supplied by Ferrofluidic Corporation, 40 Simon Street, Nashua, N.Y. 03061. A preferred seal is Model #5C-3000-C. Other types of rotary seals for the shaft could also be employed.

Figure 2:
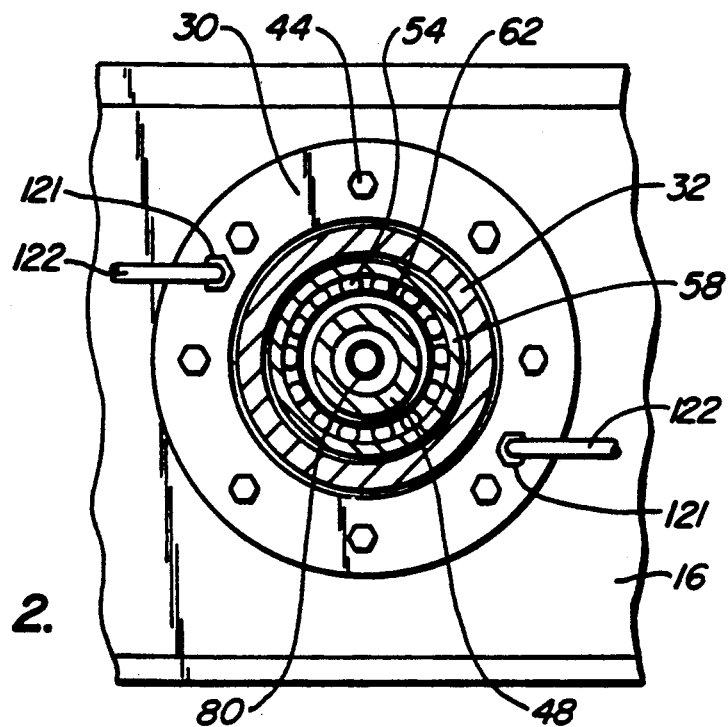
FIG. 2 is a schematic cross-section through the bearing housing perpendicular to the rotational axis of the cylindrical magnetron, taken substantially along line 2—2 of FIG. 1.

Drive shaft 48 is rotatably mounted in bearing housing 32 by bearings 52, 54 and 60 (see also FIG. 2). Bearings 52 and 54 may be included in a single duplex bearing. The bearings may be conventional ball bearings. Other types of bearing including tapered roller bearings, cylindrical roller bearings, and drawn-cup needle roller bearings may be used. Bearings 52 and 54 are located between raised shoulder portion 56 of drive shaft 48 and a cylindrical locking insert 58. This insert is removably secured to bearing housing 32. Bearing 60 is separated from bearings 52 and 54 by a cylindrical spacing sleeve 62. The bearings 52, 54 and 60 are thus spaced along drive shaft 48 to provide the cantilever support for magnetron 10. Specifically, the entire load of the magnetron is supported by the bearings such that substantially no load is transferred to vacuum seal 50.

Figure 3:
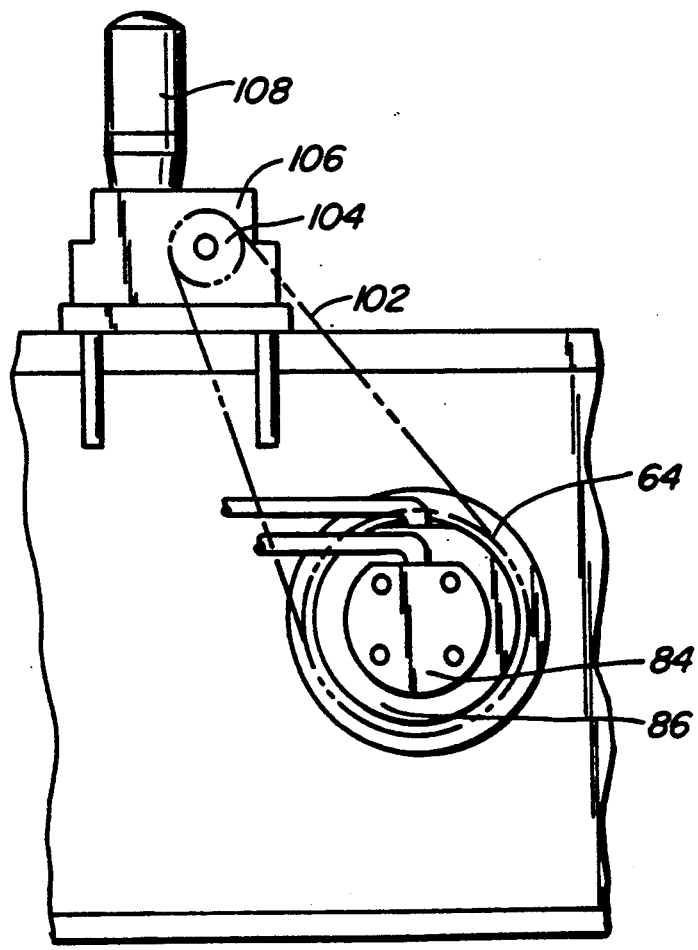
FIG. 3 is a schematic cross-section of the end of the bearing housing perpendicular to the rotational axis of the cylindrical magnetron, taken substantially along line 3—3 of FIG. 1.

A drive shaft pulley 64 (see also FIG. 3) is keyed to the drive shaft and spaced from bearing 60 by a second cylindrical spacing sleeve 66. A nut 68 is threaded onto drive shaft 48 to lock bearings 52, 54, and 60 in position. Bearing 52 is locked against shoulder 31 on the inside diameter of bearing housing 32 by cylindrical locking insert 58. Bearing 60 is allowed to float axially in cylindrical locking insert 58. As such, ferrofluidic seal 50 performs no axial location.

A sealing plug 70 is located at drive shaft end 48b which extends into the vacuum chamber. Plug 70 is clamped to the drive shaft by a nut 74, and sealed to it by vacuum seals 71 and 73, such as O-ring seals. The hollow cathode body 21 is attached to the cathode drive end plug.

A cooling liquid input tube 80 is supported in drive shaft 48. The drive shaft rotates about tube 80 by means of a bearing 82 such as a nylon ball bearing. Cooing liquid is fed through tube inlet port 84 as represented by arrow "A". The inlet port is rigidly attached to drive shaft connector housing 90 and sealed to it by a watertight O-ring seal 88. The cooling fluid exits housing 86 via port 85 as represented by arrow "B". An extension tube 87 is attached to and extends cooling liquid input tube 80 such that tube 80 is in fluid communication with inlet port 84. The drive shaft connector housing 90 is joined to drive shaft connector housing 90 by an appropriate watertight O-ring seal 92. The connector housing 90 provides an arrangement by which the drive shaft, at end 48a, is rotatably connected with fluid outlet port 85. A drive shaft extension 94 is supported in cooling liquid output housing 86 by a bearing 96. A rotary, watertight seal 98 is provided to prevent leakage of water from cooling liquid output housing 86. A mounting arm 100 connects cooling liquid output housing 86 to locking insert 58, thus preventing rotation of cooling liquid input tube 80.

The drive for cylindrical magnetron 10 is provided by means of an electric motor 108. The output of the motor is transmitted through a reduction gearbox 106 to a gearbox pulley 104 which is connected with drive shaft pulley 64 by a drive belt 102.

Electrical contact to cathode body 21 of magnetron 10 is established by means of an electrical lead 110 through a brush contact 112 in contact with drive shaft 48 via cathode drive end plug 70. As a result of this connection, bearing housing 32 is essentially at the same electrical potential as cathode body 21.

To prevent bearing housing 32 from bombardment by positive ions from the sputtering gas discharge, a dark space shield 72 is provided. The shield 72 is electrically grounded by attaching it to bearing housing 34. The shield 72 encloses bearing housing 32 and is separated from it, at all positions, by a distance less than the cathode dark space length. The cathode dark space length is about 3 mm at a pressure of about 3 millitorr and a cathode potential of about −500 volts.

The shield 72 includes a cylindrical portion 116, which is double-walled, to provide channels 118 through which a cooling liquid may be circulated. The cooling liquid is fed to and removed from cooling channels 118 by tubes 122. The tubes 122 pass through flanges 30 and 34. Specifically, the tubes 122 are led through recesses in the flange 34 and then through seals 121 in flange 30 (FIG. 2). This arrangement helps to extend the life of vacuum seal 50.

Figure 4:
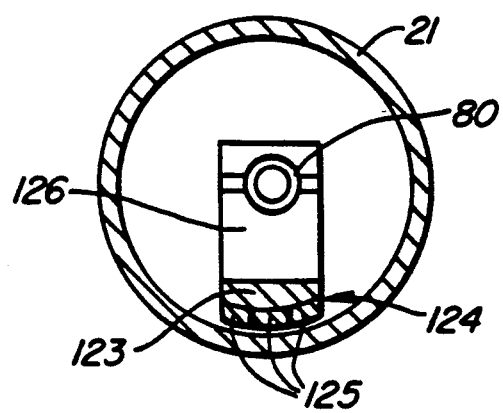
FIG. 4 is a schematic cross-section through the cathode body perpendicular to the rotational axis of the cylindrical magnetron, taken substantially along line 4—4 of FIG. 1.

A magnetic array or bar 124 is disposed inside cathode body 21. As shown in FIG. 4, array 124 is made up of a backing bar 123 to which rows of bar magnets 125 are attached. Array 124 is suspended from cooling liquuid input tube 80 by brackets 126. The cooling liquid input tube 80 is supported in the cathode free end, sealing plug 128 by a bearing 130. The plug 128 is welded in position on cathode body 21.

In summary, an apparatus for cantilever mounting a rotating cylindrical magnetron in a vacuum chamber has been described.

The present invention has been described in terms of a preferred embodiment. The invention, however, is not limited to the embodiment described and depicted. Rather, the scope of the invention is limited by the appended claims.

What is claimed is:

1. An apparatus for rotatably mounting a cylindrical magnetron in a vacuum chamber, comprising:
   a bearing housing having one end thereof extending into said vacuum chamber and the other end located outside of said vacuum chamber;
   a drive shaft rotatably mounted in said bearing housing with each end of said shaft extending beyond said bearing housing, said drive shaft having a means for attaching said cylindrical magnetron to the end of said drive shaft inside said vacuum chamber;
   a vacuum seal means located in said bearing housing for sealing said drive shaft to said bearing housing so that an interior portion thereof is isolated from said vacuum chamber; and
   means for rotatably mounting said drive shaft in said bearing housing so that the load of said cylindrical magnetron is not transferred to said vacuum seal.

2. The apparatus of claim 1 further including a means for cooling said bearing housing.

3. The apparatus of claim 2 wherein said cooling means includes a liquid cooled dark space-shield located around said bearing housing at the end thereof inside said vacuum chamber.

4. The apparatus of claim 1 wherein said rotatably mounting means includes bearings spaced along the length of said drive shaft within said bearing housing.

5. The apparatus of claim 1 further including means for making electrical connection to said cylindrical magnetron.

6. The apparatus of claim 5 wherein said electrical connection means includes said drive shaft and a brush connection in electrical contact therewith.

7. The apparatus of claim 6 further including means for electrically-isolating said cylindrical magnetron from said vacuum chamber.

8. The apparatus of claim 7 wherein said electrically isolating means includes a flange for mounting said bearing housing to said vacuum chamber and an electrically-insulating member located between said bearing housing and said flange.

9. The apparatus of claim 1 further including a pulley mounted on the end of said drive shaft outside said vacuum chamber.

10. The apparatus of claim 9 wherein said drive shaft is hollow and open at both ends.

11. The apparatus of claim 10 further including means for flowing a cooling fluid to and from said cylindrical magnetron via said drive shaft.

12. The apparatus of claim 11 in which said flowing means includes an input tube extending through said drive shaft and supported therein.

13. The apparatus of claim 12 further including a means for supporting a magnet array within said cylindrical magnetron.

14. The apparatus of claim 13 wherein said means for supporting said magnet array is said input tube.

15. The apparatus of claim 14 wherein said attaching means includes a first end plug mounted on said drive shaft at the end thereof inside said vacuum chamber.

16. The apparatus of claim 15 wherein said attaching means further includes a second end plug mounted at the end of said drive shaft outside said vacuum chamber.

17. The apparatus of claim 16 wherein said second end plug includes means for rotatably supporting said input tube.

18. The apparatus of claim 1 wherein said vacuum seal means is a ferrofluidic seal.

19. An apparatus for sputtering thin films on a substrate using a rotating cylindrical magnetron, comprising: an evacuable coating chamber; a cantilever mounting unit mounted through a wall of said coating chamber, including a bearing housing, a drive shaft mounted in said bearing housing for rotating said cylindrical magnetron, a vacuum seal for isolating at least a portion of the interior of said bearing housing from said coating chamber, and means within said bearing housing for rotatably supporting said drive shaft such that the load of said cylindrical magnetron is not transferred to said vacuum seal; and means for transporting a substrate past said cylindrical magnetron.

20. The apparatus of claim 19 wherein said rotatably supporting means includes bearings located along the length of said drive shaft in said bearing housing.

21. The apparatus of claim 20 wherein said bearings are selected from a group consisting of ball bearings, tapered roller bearings, cylindrical roller bearings, and drawn-cup needle roller bearings.

22. The apparatus of claim 20 further comprising means for cooling said bearing housing.

23. The apparatus of claim 22 wherein said cooling means includes a liquid cooled dark space shield located around said bearing housing at the end thereof inside said coating chamber.

24. The apparatus of claim 19, 20, or 22 wherein said vacuum seal is a ferrofluidic seal.

* * * * *

UNITED STATES PATENT AND TRADEMARK OFFICE
CERTIFICATE OF CORRECTION

PATENT NO. : 5,200,049
DATED : April 6, 1993
INVENTOR(S) : David E. Stevenson, et. al.

It is certified that error appears in the above-indentified patent and that said Letters Patent is hereby corrected as shown below:

Column 6:

In claim 3, line 26, delete "dark space-shield" and insert --dark-space shield--.

In claim 7, line 39, delete "electrically-isolating" and insert --electrically isolating--.

In claim 8, line 44, delete "electrically-insulating" and insert --electrically insulating--.

Column 8:

In claim 23, line 13, delete "dark space" and insert --dark-space--.

Signed and Sealed this

Eleventh Day of January, 1994

Attest:

BRUCE LEHMAN

Attesting Officer

Commissioner of Patents and Trademarks